United States Patent
Harnett et al.

(10) Patent No.: US 6,677,828 B1
(45) Date of Patent: Jan. 13, 2004

(54) METHOD OF HOT SWITCHING A PLASMA TUNER

(75) Inventors: Sean O. Harnett, Penfield, NY (US); Richard W. Brounley, Dunedin, FL (US); Richard E. Church, Rochester, NY (US)

(73) Assignee: ENI Technology, Inc., Rochester, NY (US)

( * ) Notice: Subject to any disclaimer, the term of this patent is extended or adjusted under 35 U.S.C. 154(b) by 6 days.

(21) Appl. No.: 09/640,426

(22) Filed: Aug. 17, 2000

(51) Int. Cl.$^7$ .......................... H03H 11/30; H03H 7/40
(52) U.S. Cl. ................... 333/17.3; 333/32; 315/111.21
(58) Field of Search ..................... 333/17.3, 18, 253, 333/32; 257/656; 315/111.21

(56) References Cited

U.S. PATENT DOCUMENTS

| | | | |
|---|---|---|---|
| 4,564,807 A | * | 1/1986 | Ikezi et al. ............. 324/158 D |
| 5,055,836 A | * | 10/1991 | Kane ....................... 340/825.89 |
| 5,424,691 A | * | 6/1995 | Sadinsky ................... 333/17.3 |
| 5,473,291 A | | 12/1995 | Brounley |
| 5,554,962 A | * | 9/1996 | Perreira et al. ................ 335/78 |
| 5,654,679 A | * | 8/1997 | Mavretic et al. ........... 333/17.3 |
| 6,252,354 B1 | * | 6/2001 | Collins et al. ............. 333/17.3 |

FOREIGN PATENT DOCUMENTS

WO  WO 99/14855  *  3/1999 ............ H03H/7/40

OTHER PUBLICATIONS

Millman, Jacob, Microelectronics: Digital and Analog Circuits and Systems, 1979, McGraw–Hill, p. 396.*
Alpha, Design with PIN Diodes, 6/99.

* cited by examiner

Primary Examiner—Robert Pascal
Assistant Examiner—Stephen E. Jones
(74) Attorney, Agent, or Firm—Harness, Dickey & Pierce, P.L.C.

(57) ABSTRACT

The present hot switching method and impedance matching circuit extends the tuning range of matching circuits to include increased power levels. The hot switching method and circuit includes coupling a controlled impedance network between an RF generator output and a plasma chamber input for matching impedances. The controlled impedance network includes an RF switch for switching a predetermined impedance. A device performance characteristic of the RF switch is determined. RF power is applied from the RF generator through the controlled impedance network to the plasma chamber. A signal characteristic of the impedance match is measured. The RF switch is controlled based upon the measured signal characteristic such that the impedance match is driven towards a predetermined matching range. The RF switch is switched any speed based upon the device performance characteristic.

17 Claims, 5 Drawing Sheets

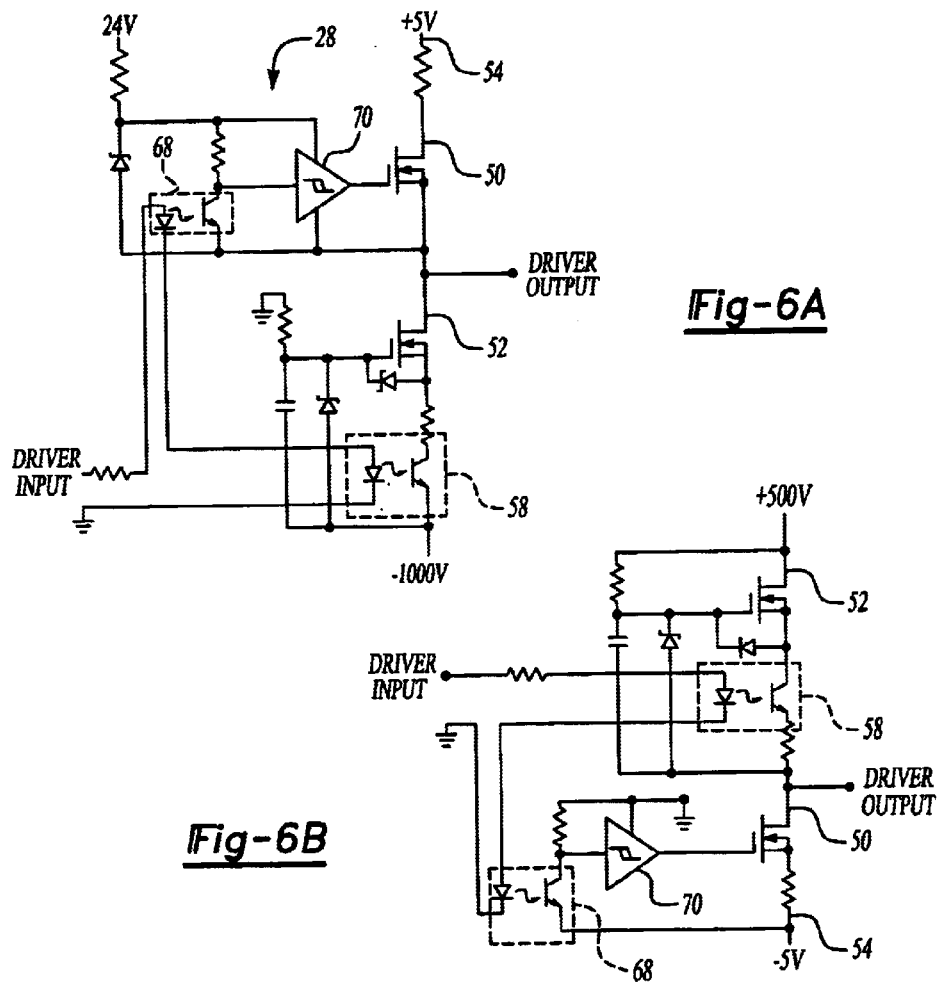
*Fig-6A*
*Fig-6B*
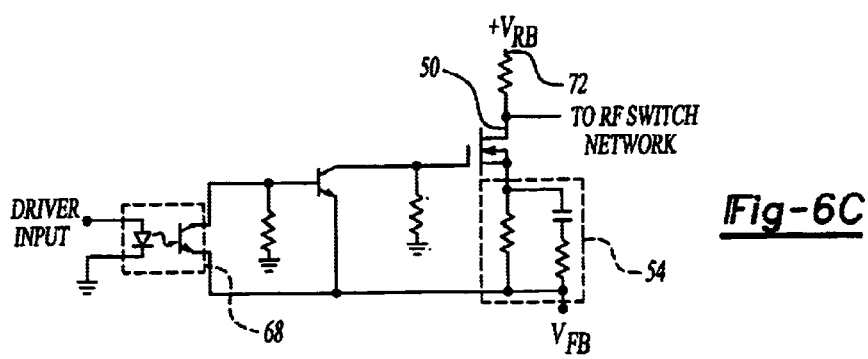
*Fig-6C*

METHOD OF HOT SWITCHING A PLASMA TUNER

BACKGROUND AND SUMMARY OF THE INVENTION

The present invention relates generally to plasma chamber tuners, and in particular to a solid-state tuner used to match the impedance of an RF generator to a plasma chamber or similar non-linear load.

A plasma chamber is a low-pressure, gas filled enclosure used in processing operations such as RF sputtering, plasma depositions, and reactive ion etching. These processing operations are used primarily for integrated circuit and compact disc fabrication. For those processing operations requiring an RF power signal, the plasma chamber is excited by an RF generator that is generally operating in the ISM frequency bands of 13.56 MHz, 27.12 MHz, and 40.68 MHz. The input impedance of the plasma chamber is highly non-linear, varying during the different operating modes of the chamber. Although lower and higher frequencies can be employed with a plasma processing system, 13.56 MHz is the predominant frequency used in the RF generator market.

Typically, an RF generator produces an RF wave at a predetermined frequency such as 13.56 MHz. The generator is coupled to the plasma chamber through a power conduit. The output of the RF generator is typically designed to be a fixed, known impedance such as 50 ohms. Since there is typically a severe impedance mismatch between the RF generator and the plasma chamber, an automatic impedance matching tuner is generally coupled between the generator and the chamber.

Impedance matching tuners have evolved recently from electromechanical tuners to solid-state tuners. Electromechanical tuners are typically motor driven devices that control a variable capacitor to match the output impedance of the generator to the plasma chamber. Although, electromechanical tuners are capable of matching an RF generator to a wide range of plasma chamber input impedances, they possess many inherent deficiencies including slow response, poor reliability, high and unpredictable power loss, and high cost.

In response to the aforementioned deficiencies of electromechanical tuners, a solid-state tuner was recently developed as described in U.S. Pat. No. 5,473,291 which is hereby incorporated by reference in its entirety. The advent of the solid-state tuner rectified many of the listed deficiencies of the electromechanical tuners providing faster response and increased reliability at low power levels, a predictable power loss, and lower cost. However, conventional solid-state tuners are limited in the RF power level that may be applied while the impedance is adjusted. Adjusting the impedance of the tuner while RF power is applied is referred to as hot switching. Conventional solid-state tuners universally exhibit poor reliability when hot switching is attempted at RF power levels exceeding approximately 300 watts.

The present hot switching method and impedance matching circuit extends the tuning range of matching circuits to include increased power levels. The hot switching method and circuit includes coupling a controlled impedance network between an RF generator output and a plasma chamber input for matching impedances. The controlled impedance network includes an RF switch for switching a predetermined impedance. A device performance characteristic of the RF switch is determined. RF power is applied from the RF generator through the controlled impedance network to the plasma chamber. A signal characteristic of the impedance match is measured. The RF switch is controlled based upon the measured signal characteristic such that the impedance match is driven towards a predetermined matching range. The RF switch is switched any speed based upon the device performance characteristic.

For a more complete understanding of the invention, its objects and advantages, reference may be had to the following specification and to the accompanying drawings.

BRIEF DESCRIPTION OF THE DRAWINGS

FIG. 1 illustrates an RF power system including a controlled impedance network in accordance with the teachings of the invention of;

FIGS. 6A–6C illustrate alternate embodiments of driver circuits in accordance with the teachings of the invention.

DETAILED DESCRIPTION OF THE PREFERRED EMBODIMENT

Figure 1:
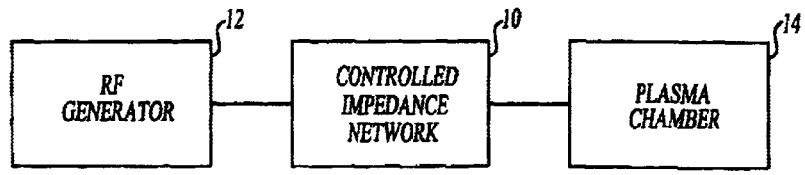

Referring to FIG. 1, a controlled impedance network 10 coupled between an RF generator output 12 and a plasma chamber input 14, is illustrated. The controlled impedance network 10 provides a tunable impedance for reducing the impedance mismatch between the generator output 12 and the input of the plasma chamber 14. Generally, the output impedance of an RF generator is approximately a fixed 50 ohms. Whereas, the input impedance of a plasma chamber is a widely varying complex impedance being typically in the range of 1–10 ohms and –j5 to –j20 ohms.

Figure 2:
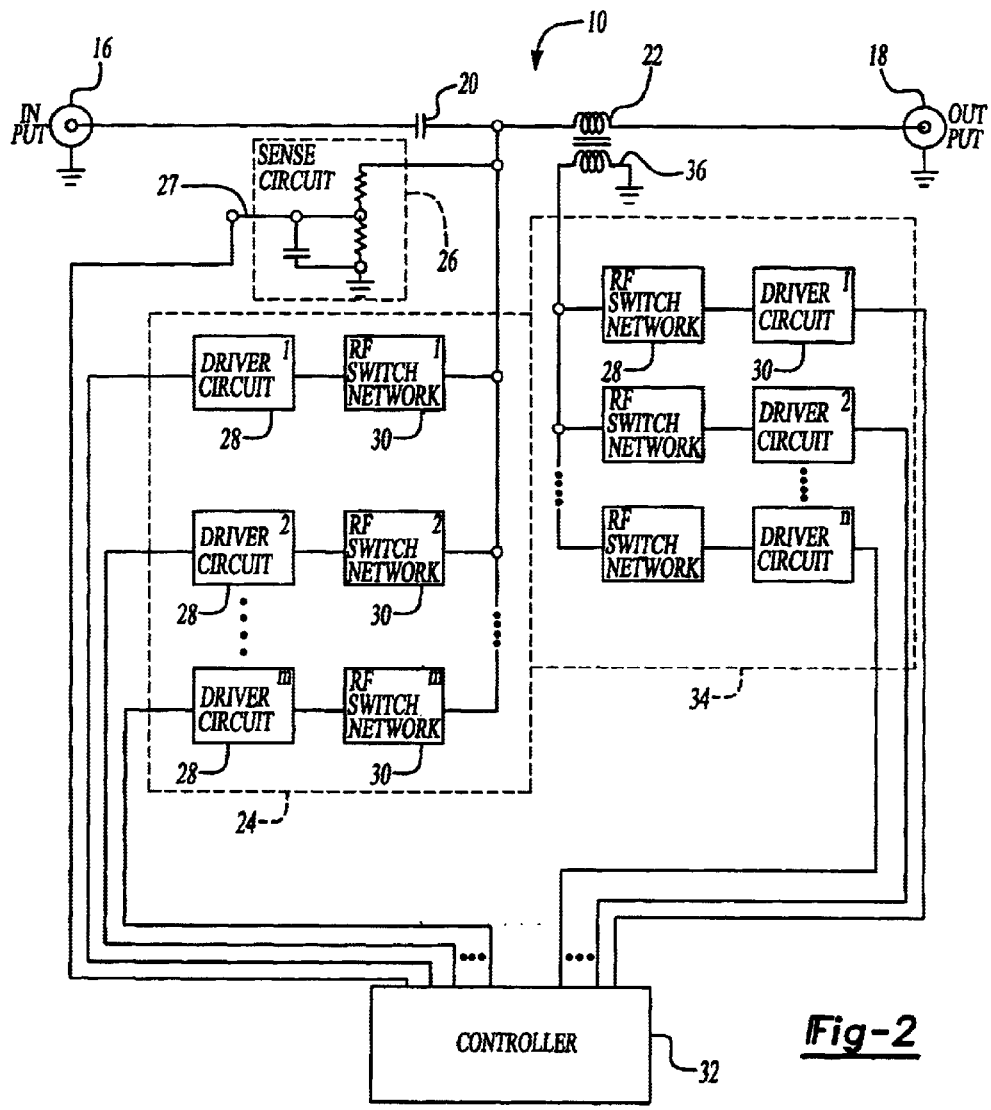
FIG. 2 is a block diagram illustrating a presently preferred embodiment of a controlled impedance network in accordance with the teachings of the invention.

Referring to FIG. 2, a presently preferred embodiment of a controlled impedance network 10 in accordance with the principles of the invention is illustrated. The controlled impedance network 10 includes an RF input 16 coupled to an RF output 18 through a blocking capacitor 20 and a coupling transformer 22. A bias sense circuit 26 is coupled to the RF line for monitoring a DC bias voltage developed at the plasma chamber. A DC bias output 27 of the bias sense circuit 26 is coupled to the controller 32. Primary and secondary switched element circuits 24 and 34 are coupled to the RF line to provide controllable capacitive and inductive impedances respectively. The primary switched element circuit 24 is connected between the blocking capacitor 20 and the coupling transformer 22. The secondary switched element circuit 34 is coupled to the RF line through a secondary winding 36 of the coupling transformer 22. A controller 32 controls the switching of primary and secondary switched element circuits 24 and 34.

The primary switched element circuit 24 is used for tuning out the real portion of the plasma chamber load. Reactive components are selectively switched into and out of the circuit to provide the load adjustment. The primary switched element circuit 24 includes multiple pairs of driver circuits 28 and RF switched networks 30 for selectively switching the reactive components. In the presently preferred embodiment the reactive components are configured in a binary weighted arrangement. However, the scope of the invention includes other arrangements such as equally weighted reactive components.

The secondary switched element circuit 34 couples a controlled impedance through the transformer 22 for tuning out the reactive portion of the plasma chamber load. Similar to the primary switched element circuit 24, pairs of driver circuits 30 and RF switch networks 28 comprise the secondary switched element circuit 34. The operation of the secondary switched element circuit 34 has been previously disclosed and claimed in U.S. Pat. No. 5,473,291, which is hereinafter incorporated by reference in its entirety.

Figure 3:
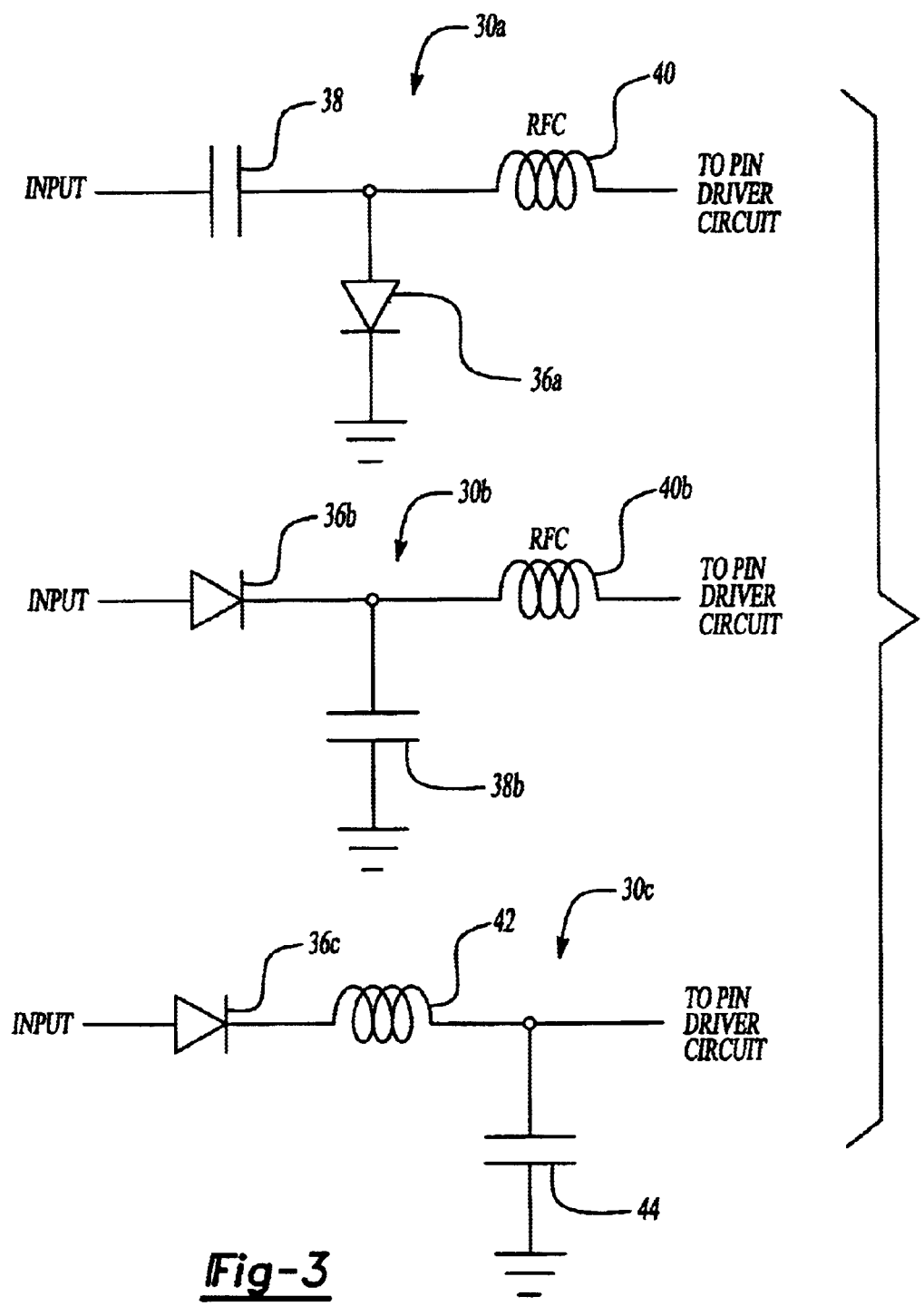
FIG. 3 illustrates several RF switch networks in accordance with the presently preferred embodiment.

Referring to FIG. 3, several alternative embodiments of the RF switch network 30 are illustrated. The presently preferred embodiment of the invention includes a cathode grounded pin diode 36a as shown in RF switch network 30a. Connected to the anode of the pin diode 36a are a switched capacitor 38 and an RF choke 40. The switched capacitor 38 connects to the switched capacitors of the other commonly connected RF switch networks 30 of the respective switched element circuit to provide a switchable impedance. The RF choke 40 isolates the RF signal that flows through the switched capacitor 38 from the associated pin driver circuit 28 coupled to the RF switch network 30. The scope of the invention includes RF switch networks having an anode guarded configuration.

A first alternative RF switch network 30b uses a non-isolated pin diode 36b connected to a switched capacitor 38b and RF choke 40b. The RF choke 40b again isolates the RF signal from the associated pin driver circuit 28, and the switched capacitor 38b provides a switchable impedance. Included with the first alternative RF switch network 30b is a DC current path coupled to the primary of transformer 22. The DC current path comprises an RF choke coupled from the primary of transformer 22 to ground. In addition, the blocking capacitor 20 is coupled between the transformer 22 and the RF output 18. The sense circuit 26 is connected to the RF output 18. A second alternative RF switch network 30c includes a switched inductor 42 to provide a switchable impedance. A pin diode 36c in series with the switched inductor 42 controls the application of impedance.

Figure 4:
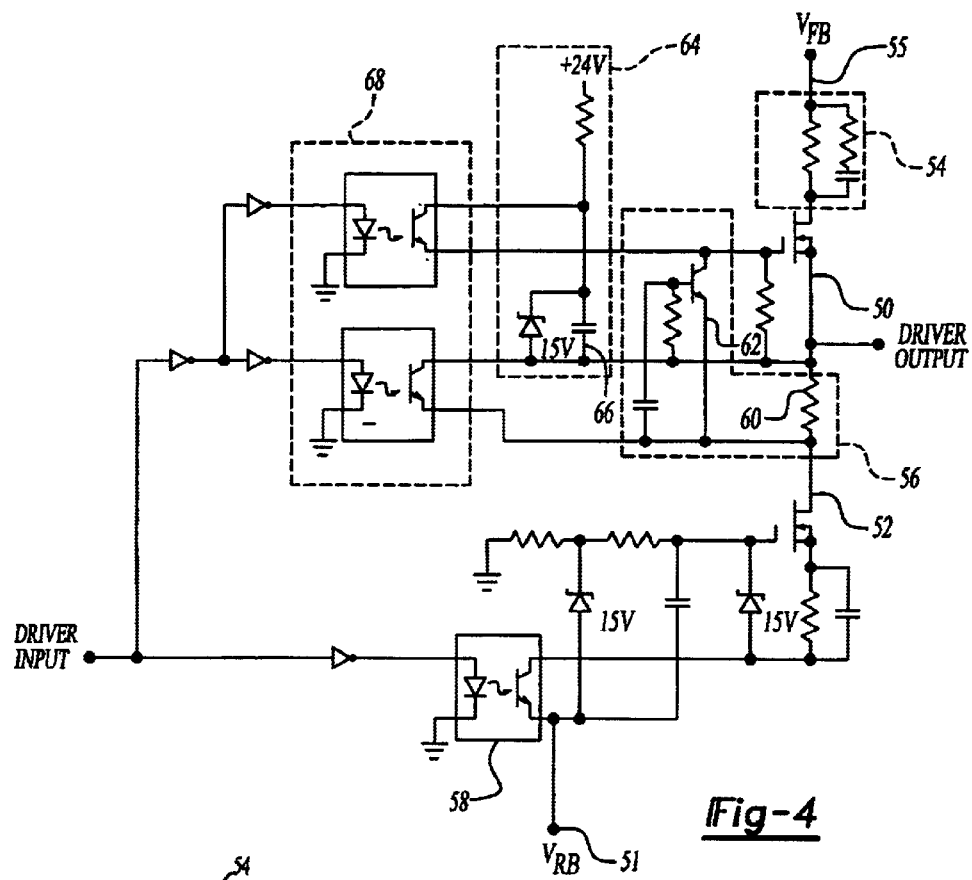
FIG. 4 illustrates a driver circuit in accordance with the teachings of the invention.

Referring to FIG. 4, a presently preferred embodiment of a driver circuit 28 is illustrated. The driver circuit 28 generates a low impedance signal on the driver output for driving an associated RF switch network 30. The driver circuit includes a forward bias switch 50 and a reverse bias switch 52 for respectively switching a forward bias voltage of +5 amps, thereby providing a forward bias current of 0.5 amps, and a reverse bias voltage of −1000 volts. In the preferred embodiment, MOSFETs are used for the forward and reverse bias switches 50 and 52, however the scope of the invention includes using other switches such as BJT's and IGBT's.

Figure 5:
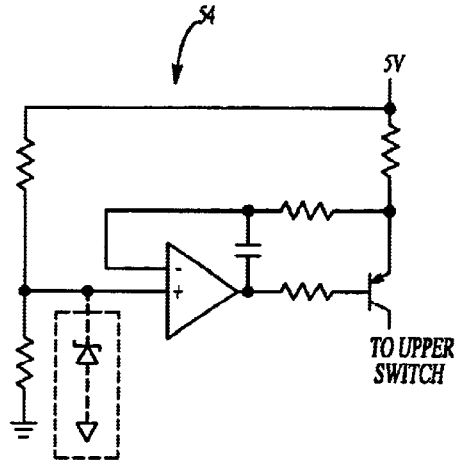
FIG. 5A illustrates a current regulator circuit in accordance with the teachings of the invention.

A current regulator circuit 54 is connected in series with a forward bias power supply 55 and the forward bias switch 50 to regulate the forward bias current supplied to the RF switch. The current regulator circuit 54 includes a resistor in parallel with an R-C lead network is used to limit the amplitude of the forward bias current sourced to the RF switch. Although a resistor-capacitor network is employed in the presently preferred embodiment, the principles of the invention may be readily extended to other passive networks as well as active current regulator circuits such as the regulator circuit illustrated in FIG. 5.

A clamp network 56 is coupled between the forward bias switch 50 and the reverse bias switch 52 for decreasing the switching time of the forward bias switch 50 and limiting cross conduction currents. A current sensing device 60 coupled between the forward bias switch 50 and the reverse bias switch 52 triggers a clamp switch 62 that accelerates the turn off of the forward bias switch 50. Clamp network 56 thus forms a feedback network for decreasing the turn-off time of the forward bias switch 50. In the presently preferred embodiment, a resistor is employed as the current sensing device 60 and a switching transistor is used for the clamp switch 62.

A bootstrap circuit 64 provides a low impedance source of energy for turning on the forward bias switch 50. The bootstrap circuit 64 includes a series resistor and a capacitor 66 and zener diode in parallel. Energy stored in the capacitor 66 while the forward bias switch 50 is off is supplied to the forward bias switch 50 at turn on to increase the switching speed of the forward bias switch 50.

An isolated cascode switch 58 is connected from the reverse bias switch 52 to the reverse bias voltage source 51. The cascode switch 58 controls the operation of the reverse bias switch 52 in addition to providing voltage isolation between the driver input and the reverse bias power supply. Preferably, an optocoupler is used as the isolated cascode switch 58. In the preferred embodiment, an HP 4N37 optocoupler is used. Using an isolated cascode switch in conjunction with the reverse bias switch 52 expands the withstand voltage capability of the cascode switch 58 and provides voltage level translation from the drive input for switching the relatively high reverse bias voltage.

An isolator circuit 68 provides voltage level translation from the driver input to the circuitry connected to the forward bias switch 50. In the presently preferred embodiment, a pair of optocouplers are used as the isolator circuit 68.

An alternative embodiment of the driver circuit 28 is illustrated in FIG. 6A. In this embodiment, the forward bias switch 50 is driven by a CMOS driver 70 having a hysteretic input. In addition, the isolator circuit 68 is comprised of a single optocoupler that is driven in series with the isolated cascode switch 58.

Referring to FIG. 6B, a third embodiment of the driver circuit 28 is illustrated. The third embodiment differs from the previous driver circuit embodiments in that the driver circuit 28 is configured for driving an anode grounded RF switch. As such, the configuration of the forward bias switch 50 and reverse bias switch 52 is reversed. A forward bias voltage of −5 volts supplies a bias current to the RF switch that is limited by the value of the resistor that is used as the current regulator 54. The cascode switch 58 is again used to operate the reverse bias switch 52, switching +500 volts to reverse bias the RF switch. The driver input is coupled to the bias switches 50 and 52 through optocouplers that are used for the cascode switch 58 and the isolator circuit 68.

Referring to FIG. 6C, a fourth embodiment of the driver circuit 28 is illustrated. The fourth embodiment includes a forward bias switch 50 and regulator circuit 54 for supplying a forward bias voltage of approximately −5 volts to an isolated RF switch. A reverse bias voltage of approximately +500 volts is applied to the RF switch through a limiting resistor 72. The driver input is coupled through an optocoupler that is used as the isolator circuit 68. An NPN transistor buffers the output of the isolator circuit 68 and drives the forward bias switch 50.

The present invention recognizes that hot switching of a controlled impedance network is facilitated by insuring that the forward bias voltage applied to a pin diode has a transition time that is less than the carrier lifetime of the pin diode. The present invention further recognizes that hot switching is enhanced by insuring that the reverse bias voltage applied to a pin diode has a transition time less than the carrier lifetime of the pin diode.

Figure 7:
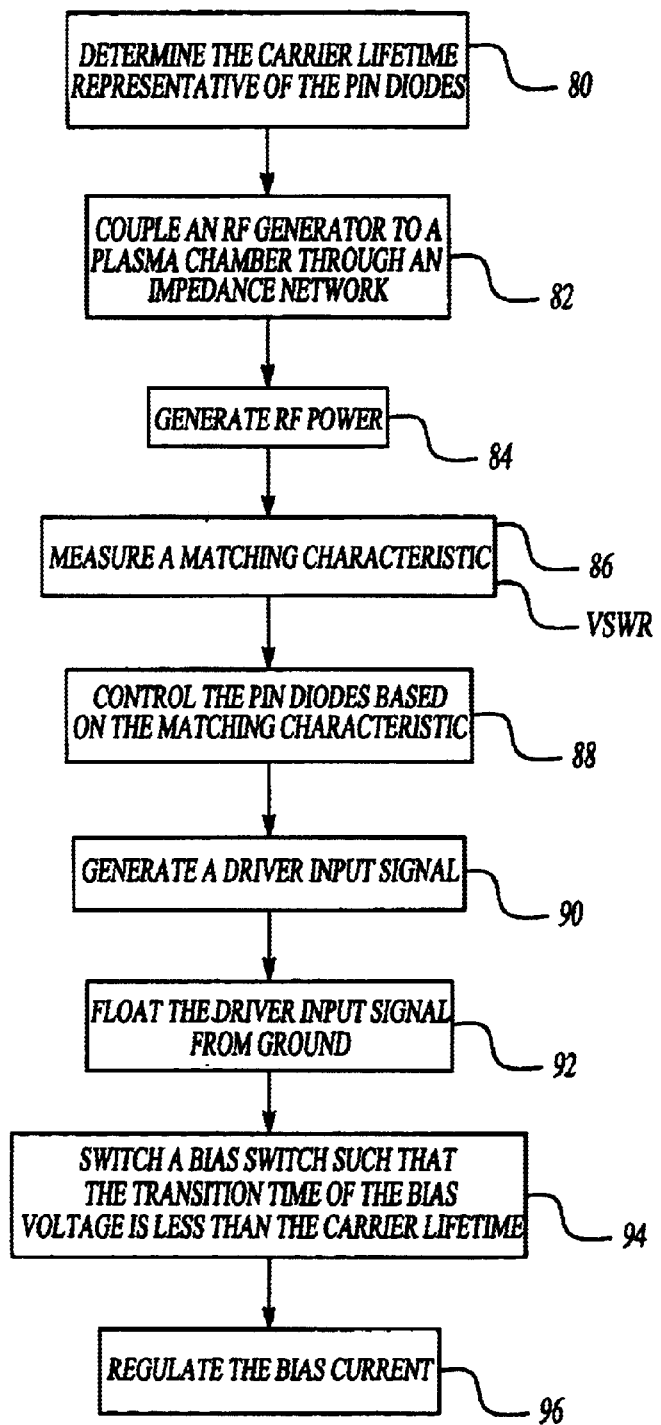
FIG. 7 illustrates a flow diagram of a process for hot switching in accordance with the teachings of the invention.

Referring to FIGS. 1 and 7, the operation of the presently preferred embodiment of the hot switching system is illustrated. At step 80, the switching characteristic of the pin diodes is determined. In the presently preferred embodiment, the carrier lifetime is used as being represented of switching characteristic. At step 82 the RF generator 12 is coupled to the plasma chamber 14 through the controlled impedance network 10. Then, at step 84 RF power is generated. At step 86, a matching characteristic of the interaction between the RF generator 12 and the plasma chamber 14 is measured. In the presently preferred embodiment the matching characteristic that is measured is the voltage standing wave ratio (VSWR). At step 88, the controller 32 determines control signals for the pin diodes based on the measured matching characteristic. At step 90, the controller 32 generates driver input signals for controlling the driver circuits 28 associated with the pin diodes. At step 92, the driver input signal is floated from ground to permit a highside switch to be driven. At step 94, a bias switch is driven by driver input signal such that the transition time of the bias voltage at the output of the bias switch is less than the pin diode carrier lifetime. At step 96, the bias current flowing through the bias switch is regulated to insure predictable RF operation of the pin diode.

The hot switching method of the present invention extends the operating range of a controlled impedance network. The method permits the switching of the controlled impedance network with high levels of RF power applied.

Thus it will be appreciated from the above that as a result of the present invention, a hot switching method and driver circuit is provided by which the principal objectives, among others, are completely fulfilled. It will be equally apparent and is contemplated that modification and/or changes may be made in the illustrated embodiment without departure from the invention. Accordingly, it is expressly intended that the foregoing description and accompanying drawings are illustrative of preferred embodiments only, not limiting, and that the true spirit and scope of the present invention will be determined by reference to the appended claims and their legal equivalent.

What is claimed is:

1. A controlled impedance network coupled between a generator output and a plasma chamber for controlling an impedance match characteristic, comprising:

a coupled transformer having a primary winding and a secondary winding, the primary winding having an effective reactance and being coupled between the generator output and the plasma chamber;

an RF switch network having an BF switch being operable to selectively couple at least one reactive element to the transformer secondary winding such that the effective reactance of the primary winding is varied; and a driver circuit coupled to the RF switch network for applying a forward bias voltage and a reverse bias voltage to the RF switch, thereby switching the RF switch network between a conduction state and a non-conduction state, the driver circuit including a reverse bias switch controlled by an isolate series cascode switch for applying the reverse bias voltage.

2. The controlled impedance network of claim 1 wherein the driver circuit further comprises a forward bias switch for applying the forward bias voltage, wherein the forward bias switch is driven by a bootstrap circuit.

3. The controlled impedance network of claim 2 further comprising a controller coupled to the driver circuit for generating a drive signal to operate the driver circuit.

4. A controlled impedance network coupled between a generator output and a plasma chamber for controlling an impedance match characteristic, comprising:

a coupled transformer having a primary winding and a secondary winding, the primary winding having an effective reactance and being coupled between the generator output and the plasma chamber;

an RF switch network having an RF switch being operable to selectively couple at least one reactive element to the transformer secondary winding such that the effective reactance of the primary winding is varied; and a driver circuit coupled to the RF switch network for applying a forward bias voltage and a reverse bias voltage to the RF switch, thereby switching the RF switch network between a conduction state and a non-conduction state, the driver circuit including a reverse bias switch controlled by an isolated series cascode switch for applying the reverse bias voltage, wherein the driver circuit further comprises a feedback network for decreasing the turn-off time of the forward bias switch.

5. A controlled impedance network coupled between a generator output and a plasma chamber for controlling an impedance match characteristic, comprising:

a coupled transformer having a primary winding and a secondary winding, the primary winding having an effective reactance and being coupled between the generator output and the plasma chamber;

an RF switch network having an RF switch being operable to selectively couple at least one reactive element to the transformer secondary winding such that the effective reactance of the primary winding is varied; and a driver circuit coupled to the RF switch network for applying a forward bias voltage and a reverse bias voltage to the RF switch, thereby switching the RF switch network between a conduction state and a non-conduction state, the driver circuit including a reverse bias switch controlled by a series cascode switch for applying the reverse bias voltage;

wherein the series cascode switch is an isolated cascode switch.

6. A controlled impedance network coupled between a generator output and a plasma chamber for controlling an impedance match characteristic, comprising:

a coupled transformer having a primary winding and a secondary winding, the primary winding having an effective reactance and being coupled between the generator output and the plasma chamber;

an RF switch network having an RIF switch being operable to selectively couple at least one reactive element to the transformer secondary winding such that the effective reactance of the primary winding is varied; and a driver circuit coupled to the RF switch network for applying a forward bias voltage and a reverse bias voltage to the RF switch, thereby switching the RF switch network between a conduction state and a non-conduction state, the driver circuit including a reverse bias switch controlled by a series cascode switch for applying the reverse bias voltage;

wherein the driver circuit further comprises a forward bias switch for applying the forward bias voltage, wherein the forward bias switch is driven by a bootstrap circuit.

7. The controlled impedance network of claim 6 further comprising a controller coupled to the driver circuit for generating a drive signal to operate the driver circuit.

8. A controlled impedance network coupled between a generator output and a plasma chamber for controlling an impedance match characteristic, comprising:

a coupled transformer having a primary winding and a secondary winding, the primary winding having an effective reactance and being coupled between the generator output and the plasma chamber;

an RF switch network having an RF switch being operable to selectively couple at least one reactive element to the transformer secondary winding such that the effective reactance of the primary winding is varied; and a driver circuit coupled to the RF switch network for applying a forward bias voltage and a reverse bias voltage to the RF switch, thereby switching the RF switch network between a conduction state and a non-conduction state, the driver circuit including a reverse bias switch controlled by a series cascode switch for applying the reverse bias voltage;

wherein the driver circuit further comprises a feedback network for decreasing the turn-off time of the forward bias switch.

9. A controlled impedance network coupled between a generator output and a plasma chamber for controlling an impedance match characteristic, comprising:

a transformer having a primary winding connected between the generator output and the plasma chamber;

at least one RF switch configured to selectively couple at least one reactive element to the transformer such that an effective reactance of the primary winding is varied based on a measurement of the impedance match characteristic while RF power is applied to the plasma chamber; and a driver circuit configured to switch a bias voltage to the RF switch using a driver input signal floated from ground, wherein the driver circuit comprises an isolated cascode switch configured to provide voltage level translation from the driver input signal.

10. A controlled impedance network coupled between a generator output and a plasma chamber for controlling an impedance match characteristic, comprising:

a transformer having a primary winding connected between the generator output and the plasma chamber;

at least one RF switch configured to selectively couple at least one reactive element to the transformer such that an effective reactance of the primary winding is varied based on a measurement of the impedance match characteristic while RF power is applied to the plasma chamber; and a driver circuit configured to switch a bias voltage to the RF switch using a driver input signal floated from ground, wherein the driver circuit further comprises:
forward and reverse bias switches configured to switch the bias voltage; and
a clamp network coupled between the bias switches and configured to decrease a switching time of the forward bias switch.

11. The controlled impedance network of claim 10 wherein the driver circuit further comprises a bootstrap circuit configured to increase a switching speed of the forward bias switch.

12. The controlled impedance network of claim 10 wherein the driver circuit forward and reverse bias switches are further configured to switch the bias voltage in less time than a carrier lifetime of the RF switch.

13. A controlled impedance network coupled between a generator output and a plasma chamber for controlling an impedance match characteristic, comprising:

a transformer having a primary winding connected between the generator output and the plasma chamber;

at least one RF switch configured to selectively couple at least one reactive element to the transformer such that an effective reactance of the primary winding is varied based on a measurement of the impedance match characteristic while RF power is applied to the plasma chamber; and a driver circuit configured to switch a bias voltage to the RF switch using a driver input signal floated from ground, wherein the driver circuit comprises first and second optocouplers connected in series with the driver input signal.

14. A controlled impedance network coupled between a generator output and a plasma chamber for controlling an impedance match characteristic, comprising:

a transformer having a primary winding connected between the generator output and the plasma chamber;

at least one RF switch configured to selectively couple at least one reactive element to the transformer such that an effective reactance of the primary winding is varied based on a measurement of the impedance match characteristic while RF power is applied to the plasma chamber; and a driver circuit configured to switch a bias voltage to the RF switch using a driver input signal floated from ground, wherein the driver circuit further comprises a reverse bias switch and an isolated cascode switch configured to control the reverse bias switch.

15. A controlled impedance network coupled between a generator output and a plasma chamber for controlling an impedance match characteristic, comprising:

a transformer having a primary winding connected between the generator output and the plasma chamber;

at least one RF switch configured to selectively couple at least one reactive element to the transformer such that an effective reactance of the primary winding is varied based on a measurement of the impedance match characteristic while RF power is applied to the plasma chamber; and a driver circuit configured to switch a bias voltage to the RF switch using a driver input signal floated from ground, wherein the driver circuit further comprises a forward bias power supply, a forward bias switch and a current regulator connected in series between the forward bias power supply and the forward bias switch.

16. The controlled impedance network of claim 15 wherein the driver circuit further comprises a feedback network for decreasing the turn-off time of the forward bias switch.

17. A controlled impedance network coupled between a generator output and a plasma chamber for controlling an impedance match characteristic, comprising:

a transformer having a primary winding connected between the generator output and the plasma chamber;

at least one RF switch configured to selectively couple at least one reactive element to the transformer such that an effective reactance of the primary winding is varied based on a measurement of the impedance match characteristic while RF power is applied to the plasma chamber, wherein the at least one RF switch comprises a plurality of RF switches configured to selectively couple a plurality of binary weighted reactive elements with the transformer; and a driver circuit configured to switch a bias voltage to the RF switch using a driver input signal floated from ground.

* * * * *

UNITED STATES PATENT AND TRADEMARK OFFICE
CERTIFICATE OF CORRECTION

PATENT NO.     : 6,677,828 B1                                                   Page 1 of 1
DATED          : January 13, 2004
INVENTOR(S)    : Sean O. Harnett et al.

It is certified that error appears in the above-identified patent and that said Letters Patent is hereby corrected as shown below:

Column 5,
Line 56, "BF" should be -- RF --.
Line 66, "isolate" should be -- isolated --.

Column 6,
Line 60, "RIF" should be -- RF --.

Column 10,
Line 3, "blas" should be -- bias --.

Signed and Sealed this

Seventeenth Day of August, 2004

JON W. DUDAS
*Acting Director of the United States Patent and Trademark Office*